United States Patent [19]
Chaparala

[11] Patent Number: 5,977,767
[45] Date of Patent: Nov. 2, 1999

[54] NULLING LOOP CONFIGURATION FOR AN ELECTRICALLY INSULATING CANTILEVER MAGNETOMETER

[75] Inventor: Murali Chaparala, Charlottesville, Va.

[73] Assignee: Michael J. Naughton, Norwood, Mass.; part interest to each

[21] Appl. No.: 09/039,723

[22] Filed: Mar. 16, 1998

Related U.S. Application Data

[63] Continuation-in-part of application No. 08/640,101, Apr. 30, 1996, Pat. No. 5,739,686.

[51] Int. Cl.$^6$ .............................. G01R 33/02; G01R 27/28
[52] U.S. Cl. ............................................. 324/244; 324/260
[58] Field of Search ..................................... 324/244, 256, 324/257, 258, 259, 260, 225, 658, 661

[56] References Cited

U.S. PATENT DOCUMENTS 5,739,686   4/1998   Naughton et al. ...................... 324/260

*Primary Examiner*—Walter E. Snow
*Attorney, Agent, or Firm*—Notaro & Michalos P.C.

[57] ABSTRACT

A high sensitivity torque and force cantilever magnetometer has a cantilever with isolated capacitance detection and nulling circuits which provides increased sensitivity and accuracy to measurements of a magnetic moment of a sample placed on the cantilever and exposed to a magnetic field. Magnetic detection is by electrical capacitance between a metallized plate and the cantilever. The cantilever can be used to measure both isotropic and anisotropic magnetism. The cantilever is constructed of multiple layers of conducting and insulating materials to eliminate leakage current. The magnetometer measures the magnitude of a current through a null detection circuit having at least one nulling loop deposited on the cantilever required to maintain a constant capacitance between the cantilever and a metallized plate to determine the magnetization of the sample. The null detection circuit eliminates capacitance drift and improves the accuracy of the magnetometer. Nulling loop configurations for separately and accurately balancing force and torque terms generated by interaction between the nulling loops and the magnetic field on the cantilever further enhance the sensitivity of the cantilever.

13 Claims, 10 Drawing Sheets

NULLING LOOP CONFIGURATION FOR AN ELECTRICALLY INSULATING CANTILEVER MAGNETOMETER

CROSS-REFERENCE TO RELATED APPLICATIONS

This application is a continuation-in-part of U.S. patent application Ser. No. 08/640,101, filed Apr. 30 1996, now U.S. Pat. No. 5,739,686, which application is hereby incorporated by reference in its entirety.

BACKGROUND AND FIELD OF THE INVENTION

The present invention relates to a new and useful nulling loop configuration for a cantilever magnetometer which can be used to measure magnetic properties of a sample specimen, and in particular to a high sensitivity magnetometer having a cantilever sensing element which can be used in a wide range of magnetic fields and temperatures without any significant degradation in accuracy.

Methods and devices for measuring a magnetic moment of a single crystal sample in a magnetic field using cantilever capacitance have been in existence for about 20 years, while methods for measuring the magnetic properties of single crystals using magnetic torque have been known for about 60 years. For example, a discussion of one type of magnetic torque balance is provided by F. B. Humphrey, et al., in "Sensitive Automatic Torque Balance for Thin Magnetic Film," Rev. Sci. Instr., v.34, p.348 (1963). An early discussion of torque magnetometers can be found in Williams, "Some Uses of the Torque Magnetometer," Rev. Sci. Instr. v.8, p.56 (1936).

There are two cases which can occur when a sample crystal is subjected to a magnetic field. If the sample material has an anisotropic magnetic moment, a uniform magnetic field will cause a magnetic torque, $\tau = m \times B$, (where m is the magnetization or anisotropic susceptibility, and B is the magnetic flux of the field) to be exerted on the sample, thereby causing a torsional displacement of the sample.

If the sample material is isotropic in nature, then a uniform magnetic field will not generate a magnetic torque, and instead, a magnetic field gradient $\nabla B$ is required. The force generated is $F = m \cdot \nabla B$, where m is the magnetization of the sample. The force then causes a displacement of the sample.

These magnetometry techniques are often employed with superconducting materials and used in high magnetic fields and/or low temperatures. Articles discussing such uses include, Brooks, et al., "Small sample magnetometers for simultaneous magnetic and resistive measurements at low temperatures and high magnetic fields," Rev. Sci. Instr. v.58, p.117 (1987), and, Qvarford, et al., "Microtorquemeter for magnetization measurements on small superconducting samples," Rev. Sci. Instr. v.63, p.5726 (1992).

It is also known to use pulsed magnetic fields, which are generated by the rapid release of large amounts of energy through a coil. The resulting magnetic field reaches a peak value within a very short time—usually 0.01 to 0.1 seconds—and immediately thereafter returns to zero. Pulsed fields are advantageous for use with cantilever magnetometry techniques because the very short periods in which the magnetic fields are generated do not induce as much thermal heating in the coil windings. Since a current is only applied in short, rapid bursts in a pulsed coil, much larger currents may be used without melting the coil. Thus, greater magnitude magnetic fields can be generated using pulsed magnetic fields without damage to conventional equipement. Currently, pulsed fields in the range of 70 Tesla can be generated, and it is expected that 100 Tesla fields will be possible in the near future. These field strengths are about 3 times greater than fields generated using conventional DC magnetic field generation techniques.

Cantilever magnetometry technology is used to measure the magnetic properties of the sample using the relationship between the magnetic force (or torque) and the displacement of a cantilever beam caused by the force or torque exerted on the sample.

The sample is placed on a cantilever and subjected to a magnetic field. Reaction between the magnetism of the sample and the magnetic field causes a displacement of the sample which can be measured in one of several ways. The displacement is proportional to the magnetic properties of the sample.

One known device which uses capacitance for measuring the displacement is disclosed in the Brooks article, supra. It measures the capacitance change between two electrodes caused by displacement of the sample.

A commercially available device which is commonly used to measure magnetic moments in low strength magnetic fields is the superconducting quantum interference device (SQUID). This device's sensitivity is approximately $10^{-9}$ Joules/Tesla in a range of magnetic field strengths from 0.01 Tesla to about 7 Tesla. At increasingly higher magnetic field strengths, this device's sensitivity can decrease considerably due to interference from high magnetic fields. The Qvarford article, supra, discusses other limitations of the superconducting quantum interference device.

Another, more advanced device for measuring magnetic properties of superconducting materials is disclosed in an article by Chaparala, et al., entitled "Capacitance Platform Magnetometer for Thin Film and Small Crystal Superconductor Studies" AIP Conf. Proc., p.407 (1993).

The device disclosed by Chaparala, et al., is a silicon wafer cantilever with gold lead wires on a top side, and a metallized bottom side, electrically connected to a capacitance bridge. The bottom side of the wafer acts as the upper plate of a capacitor. The bottom plate of the capacitor is a metallized plate separate from the wafer. The gold lead wires form a symmetrical pair of nulling loops on the top side. Several single electrical conductivity leads extend along the cantilever top side between the loops. A sample is placed in between the nulling loops in electrical contact with the single leads.

Both magnetic torque and magnetic force may be measured with the device. However, the sensitivity of this device, while better than other known devices, such as the superconducting quantum interference device (SQUID), is still limited by noise and leakage currents between the capacitance and the nulling loop circuits and to the specimen. Temperature differences can also affect the sensitivity of the Chaparala, et al. device.

Nulling loops such as the type described by Chaparala, et al. have unbalanced segments which generate a mixture of force and torque components due to interaction with the magnetic field, even when the sample and magnetic field are specifically arranged to use the cantilever to detect either torque or force. Typically, the ratio is about 80% of one component and 20% of the other. For example, when the sample and magnetic field are designed to generate only a torque component, the unbalanced nulling loops will generate both torque and force components in a ratio of about 80% torque to 20% force. Thus, while the torque cantilever may be nulled, the calibration is not 100% accurate due to the unbalanced segments interaction with the magnetic field.

SUMMARY OF THE INVENTION

It is a primary object of this invention to provide a highly sensitive torque and force cantilever magnetometer for measuring the magnetic properties of a sample material.

It is a further object of this invention to provide an improved nulling loop configuration for a cantilever magnetometer which permits an accurate and separate nulling of force and torque components exerted by interaction with a magnetic field such that a pure torque only is generated by the nulling loops.

Another object of the invention is to provide a nulling loop configuration for generating only a pure force exerted on the nulling loops by interaction with a magnetic field.

Accordingly, an electrically insulated cantilever sensing element is provided which can be used to measure magnetic properties of a sample by electrical capacitance, or by electrical resistance of a piezoactive circuit integrated with the insulator material. The cantilever magnetometer has a null detection circuit and a simultaneous electrical resistivity measurement circuit, both of which are electrically isolated from the magnetic signal sensing circuit and from each other. An electrically isolated thermometry circuit integrated with the cantilever and placed in close proximity to the sample is used to make accurate measurements of the sample temperature. Temperature and magnetic field dependent background signals from the cantilever itself are eliminated by a bridge subtraction circuit.

The cantilever element is an integrated piece which has a base portion with a measurement platform connected to it by an elongated neck. Both the platform and base are wider in plan than the neck portion.

The sample being measured is rigidly adhered to the cantilever measurement platform surface and subjected to a magnetic field. The resulting signals produced in the various circuits on the cantilever are indicative of the magnetic qualities of the sample.

The cantilever element of the invention is composed of several layers of materials adhered to each other. A base of an electrically insulating material, or dielectric, such as silicon coated on its top side with a layer of silicon nitride ($Si_3N_4$), has an adhesion layer of a metal, such as chromium or titanium, applied to each of its bottom and top sides. A conductive layer of gold or other electrically conducting metal is adjacent each adhesion layer.

The bottom conductive layer is an etched or deposited pattern of several adjacent pairs of L-shaped leads which inhibit the formation of eddy currents, while acting as the top plate of a capacitor. The elimination of eddy currents enhances the sensitivity of the cantilever.

The bottom conductive layer of the cantilever element acts as the top plate of a capacitor. A block, or other support, located below the bottom conductive layer of the cantilever has a metallized plate surface spaced apart from and opposed to the bottom conductive layer. The metallized plate surface is the bottom plate of the capacitor and is electrically connected to a different side of the capacitance bridge.

The top conductive layer has several individual etched or deposited circuits. The top layer contains balanced force and torque nulling loop circuits, a detection circuit using a piezoactive material, one or more pairs of electrical transport leads, and a capacitance bridge lead for electrically connecting the bottom conductive layer of the cantilever to one side of a capacitance bridge. A thermometry thermal link platform is placed in contact with the circuits.

In an embodiment of the cantilever useful for eliminating background noise, a second cantilever of similar composition is placed in proximity to the first cantilever, or the second cantilever can be formed from the same layers as the first cantilever. The second cantilever is subjected to the same magnetic fields, however, no sample is placed on the second cantilever; the capacitance changes in the second cantilever are removed from the measurement by capacitance bridge subtraction.

The cantilever of the invention has improved sensitivity and is capable of measuring the magnetic moments of samples in higher strength fields with greater accuracy than other known devices. The cantilever can function properly in either DC or pulsed magnetic fields.

The nulling loop circuits allow the cantilever to be calibrated while it is in place; the calibration is limited only by the ability to measure the current through the loops. Further, by measuring the current through the loops required to maintain the same capacitance value between the metallized plate and bottom conductive layer of the cantilever, the magnetic force or torque can be determined directly, and more accurately than known devices.

In one embodiment, a pair of nulling loops are provided having improved separation of force and torque components acting on the nulling loops due to interaction with a magnetic field. The nulling loop configuration may be used to cancel or substantially eliminate the effect of magnetic force on the cantilever, such that only magnetic torque is generated and nulled using a nulling loop circuit to balance the cantilever by changing the current passing through the nulling loops. The nulling loop configuration incorporates a pair of parallel leads connecting the loops at their ends on the measurement platform and adjacent the cantilever neck.

In a second embodiment, the nulling loops are configured so that one nulling loop lead of each loop is located directly above the other loop lead and vertically separated by an insulating layer. The vertically offset lead may be connected to rest of the loop lead by vertical openings in the insulation layer at corner nodes.

A force only configuration is provided as well. The force-only nulling loop configuration is provided to separate the torque and force components such that only magnetic force is sensed and balanced by the force-sensitive nulling loops. The force-only nulling loops may be arranged in conjunction with one of the other nulling loop configurations, either as a pair having one force-only nulling loop one within each nulling loop, or as a single force-only nulling loop centered between the other nulling loops on the cantilever. The ends of the force-only nulling loops are located at the centerline of where the sample being studied is placed.

The device of the invention can be used to measure magnetic fields by mounting a known sample on the cantilever and then exposing the device to a magnetic field as well.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
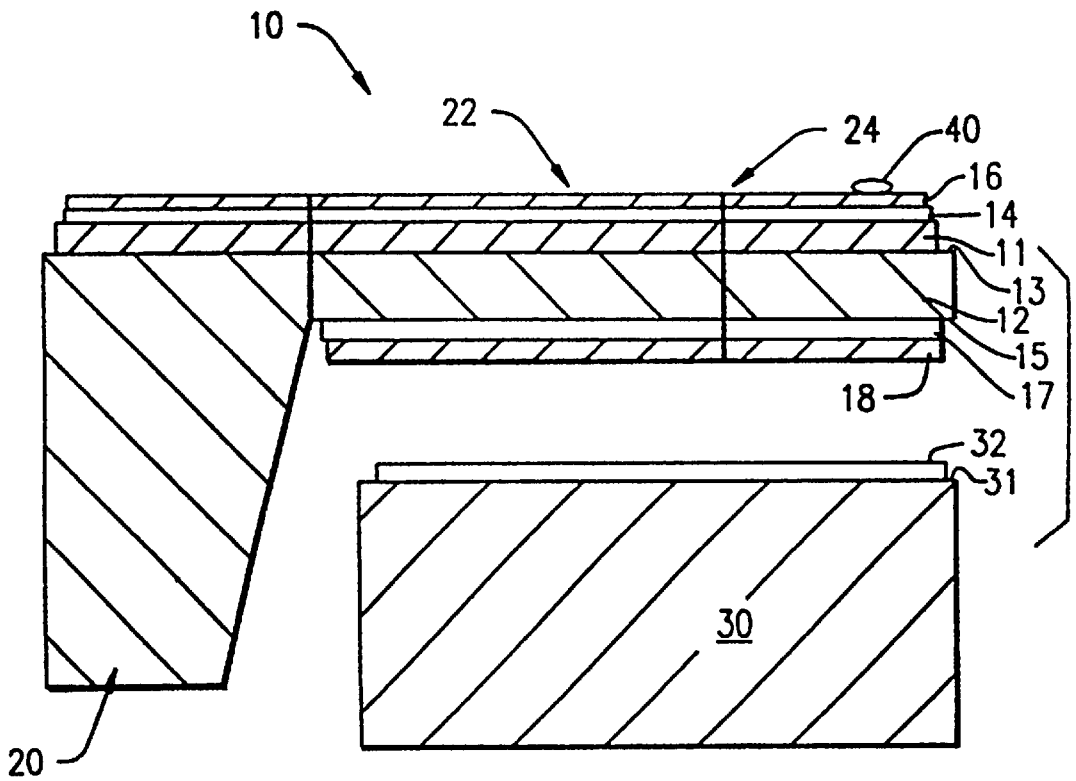
FIG. 1 is a partial sectional side elevation view of a cantilever element of the invention.

Turning now to the drawings, FIG. 1 shows a cantilever, generally designated 10, placed in proximity to a block 30.

Cantilever 10 is an integrated piece of layered materials. A dielectric substrate 12 forms the basic shape of the cantilever 10. A base 20 is connected to measurement platform 24 by an elongate neck 22. The base 20 and platform 24 are both rectangular in plan, while base 20 of substrate 12 is thicker than either platform 24 or neck 22. Suitable thicknesses for the base 20, and neck 22 and platform 24, are 250 µm and 5 µm, respectively. Neck 22 is narrower than both base 20 and platform 24 and is capable of only vertical motion.

The remaining layers are directly or indirectly adhered to either the top surface 13 or bottom surface 15 of the substrate 12.

Top surface 13 of substrate 12 may have a coating of insulating material 11 applied. An adhesion layer 14 of a non-magnetic metal contacts insulating material 11. Finally, a top conducting layer 16 is deposited onto adhesion layer 14.

Bottom surface 15 of substrate 12 is covered by a second adhesion layer 17 of a similar material as adhesion layer 14. A bottom conducting layer 18 is deposited onto adhesion layer 17. While not shown in FIG. 1, a portion of bottom conducting layer 18 may extend onto base 20 of substrate 12, as shown as lead 51 in FIG. 4. An acceptable thickness for bottom conducting layer 18 is 50 nm.

The substrate 12 is preferably made of silicon, with insulator 11 being silicon nitride ($Si_3N_4$). Alternatively, substrate 12 and insulator layer 11 may be a single substrate 12 of silicon, or another dielectric, such as the commercially available polymer KAPTON (made by DuPont), or other nonconducting polyimide. The substrate is made 4500 nm thick in a preferred embodiment. When insulator layer 11 is used, it can be about 10 nm thick.

Adhesion layers 14, 17 are preferably made of titanium, although other non-magnetic materials are suitable, such as chromium. The conducting layers 16, 18 are gold or other good conducting metal which is easily etched or deposited onto adhesion layers 14, 17. A preferred thickness for each of the adhesion layers is 3 nm. If one or both of the conducting layers 16, 18 is also sufficiently adhesive, then adhesive layers 14, 17 are not required, and the conducting layers may be deposited directly onto the insulator layer 11 and substrate 12, respectively.

Block 30 has top surface 31 which supports metallized plate 32. Block 30 is placed a distance away from cantilever 10 so as to produce a capacitance gap between metallized plate 32 and bottom conducting layer 18. The gap is preferably between 10 and 100 µm, although larger and smaller gaps may be used. The block 30 can be made of any non-magnetic insulator, such as glass. Metallized plate 32 is a good conductor, such as gold or copper. A contact connection 52 is provided on plate 32 for connecting the plate to one side of a capacitance bridge circuit 50.

A sample 40 is placed on the cantilever platform 24 on top conducting layer 16 to have its magnetic properties analyzed. Sample 40 may be a single crystal, a polycrystal, or an amorphous specimen.

Figure 2:
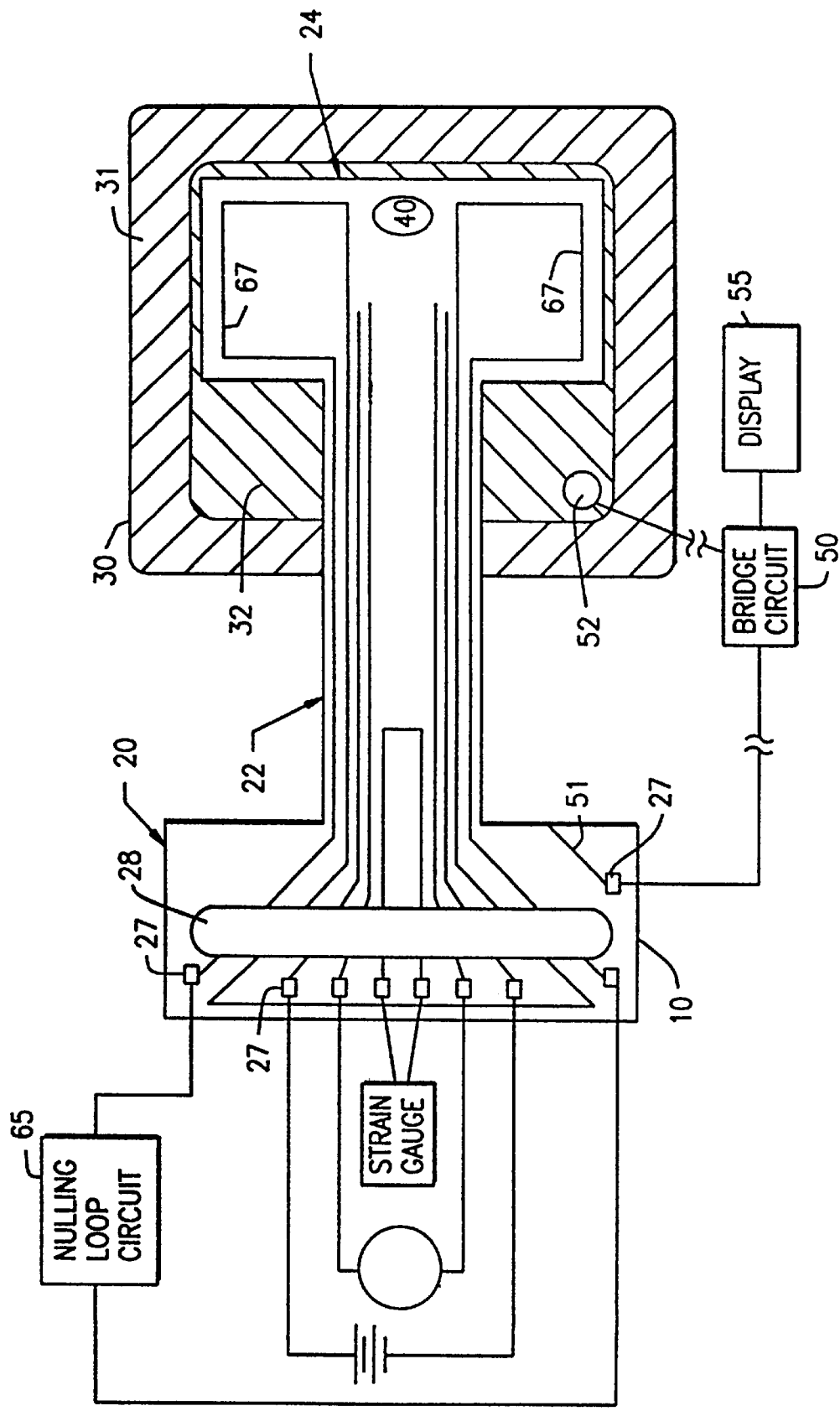
FIG. 2 is an electro-mechanical schematic top plan view of a single cantilever element.

The various electrical circuits etched or deposited as top conducting layer 18 and which can be used with cantilever 10 are shown in FIG. 2. An acceptable thickness for the top conducting layer is 100 nm.

Symmetrical nulling loops 67 are provided on each side of platform 24. The nulling loops 67 are single loops which conform roughly to the outline of the platform 24. The loops are open on the side nearest the neck 22, and the leads forming the loops 67 extend parallel along the neck 22 to the base 20 of cantilever 10. Two of the leads of the single loops are connected in the base 20 and the other two leads end in contacts 27, which can be electrically connected to a nulling loop circuit 65. Nulling loop circuit 65 is used to provide and measure a variable-sized current to loops 67, which will generate a directly proportionately sized magnetic field. Nulling loop circuit 65 may consist of an ammeter in series with a current source.

Figure 4:
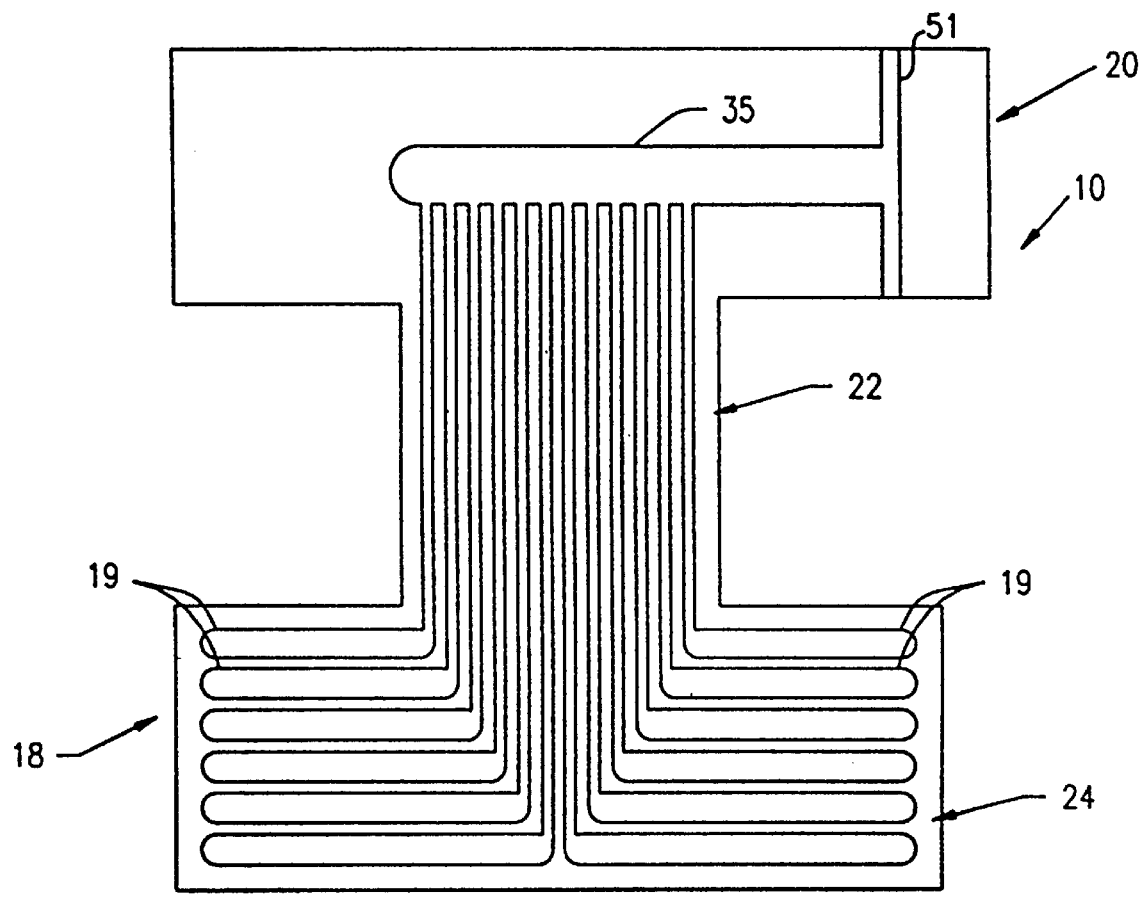
FIG. 4 is a bottom plan view of the cantilever element of FIG. 1.

Capacitor plate lead 51 connects the L-shaped capacitor electrode leads 19 and capacitor electrode bus 35 of the bottom conductive layer 18, as shown in FIG. 4, to a contact 27 on the top conductive layer 16. Lead 51 is connected via contact 27 to the other side of capacitor bridge circuit 50. The purpose of the particular pattern of electrode leads 19 is to minimize eddy current effects.

Capacitor bridge circuit 50 may be any known capacitance bridge circuit, such as a Wheatstone bridge, which has a sensitivity of at least $10^{-4}$ pF. The display 55 indicates when the bridge is balanced and can be a simple analog meter or a digital display. Commercially available bridges include General Radio GR 1615 and Andeen Hagerling 2500A bridges.

Figure 3:
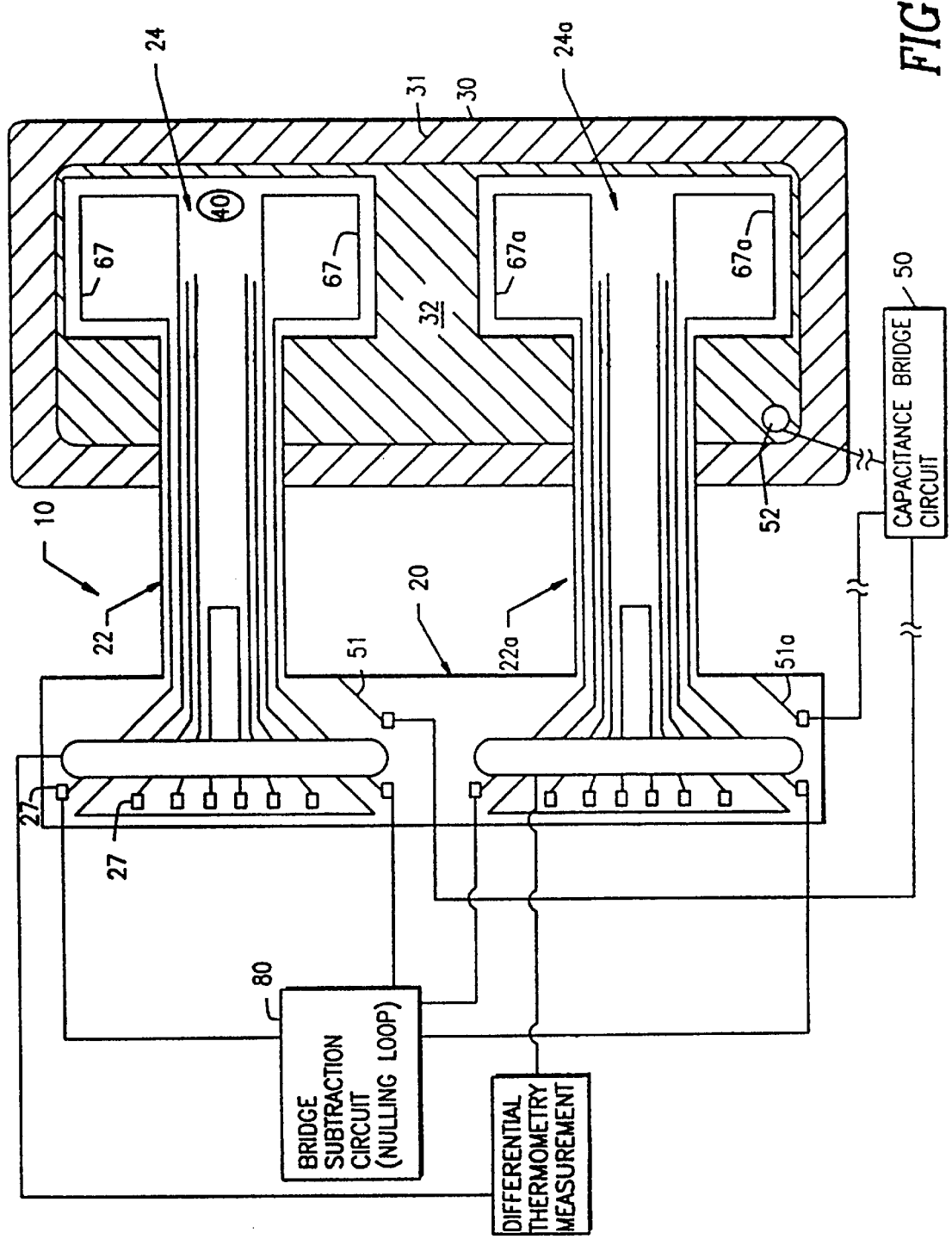
FIG. 3 is an electro-mechanical schematic top plan view of an alternate embodiment of the cantilever of the invention.

In FIG. 3, an embodiment of the cantilever 10 in which two identical cantilevers 10 are formed as one unit has a common base 20, with necks 22, 22a extending outward over block 30 and metallized plate 32 and ending in measurement platforms 24, 24a. One measurement platform 24 has a sample 40 placed on it between nulling loops 67.

Each cantilever 10 has the bottom conductive layer 18 connected via capacitor plate leads 51, 51a to capacitance bridge circuit 50. Metallized plate 32 is connected to capacitance bridge circuit 50 as well.

The nulling loops 67, 67a are connected across a nulling loop bridge subtraction circuit 80. The bridge subtraction circuit 80 may be any known bridge circuit which can subtract the signal from the reference cantilever nulling loop 67a from the sample cantilever nulling loop 67. Thermometry links 28, 28a may also be connected to a differential measurement device 85. While not shown in FIG. 3, the electrical transport leads 72, 72a and strain loops 62, 62a may be connected to corresponding circuits as shown in FIG. 2.

In the capacitance mode, the cantilever 10 is utilized in the following manner. The sample 40, usually a single crystal, although other types of samples may be measured, is rigidly adhered to the top surface of the cantilever measurement platform 40 between the nulling loops 67 using a suitable adhesive. The sample 40 and cantilever 10 are oriented relative to block 30, such that bottom conducting surface 18 and metallized plate 32 form the top and bottom plates, respectively, of a capacitor. When the cantilever is connected as described above, it is subjected to a magnetic field.

Depending on the magnetic nature (i.e. anisotropic or isotropic) of the sample, a constant or gradient magnetic field is used.

If the sample 40 possesses anisotropic magnetism, and the magnetic moment arising from the interaction of the sample 40 magnetism with the externally applied magnetic field does not align parallel or antiparallel with the applied magnetic field, the sample 40 will experience a magnetic torque, $\tau$, defined as $\tau = m \cdot B$, where m is the magnetization and B is the magnetic field strength. The torque will cause the sample 40 to rotate. Since the sample is rigidly attached to the measurement platform of the cantilever 10, the platform 24 will also tend to rotate, or deflect.

The deflection causes the capacitance of the capacitor formed by the bottom conductive layer 18 (capacitor electrode leads 19) of the cantilever 10, which forms the top plate of the capacitor, and the metallized plate 32, which forms the bottom plate, to change as the gap between the two plates increases or decreases. This change can be measured using bridge circuit 50.

The change in capacitance can usually be measured accurately, with resolution to about 1 to 10 aF. A typical equilibrium capacitance, that is, the capacitance before the magnetic field is enabled, is about 0.1 to 1 pF.

The change in capacitance, $\Delta C$, will be directly related to the magnetism of the sample 40. This assumes that a harmonic restoring force according to Hooke's law governs the mechanical response of the cantilever 10. The harmonic approximation can be used if the deflection of the cantilever measurement platform 24, $\Delta d$, is small; for a small $\Delta d$, the torque $\tau$ is proportional to $\Delta d$. The $\Delta C$ is proportional to $\Delta d/(d(d + \Delta d))$, and the torque, $\tau$, is therefore linearly proportional to the capacitance change $\Delta C$ to first order. Depending on the size of sample 40, the deviation from linearity can be between 0–10%. However, when a null deflection feedback circuit, such as the nulling loops 67, is used, the linearity varies less than 0.01%. This results in the $\Delta C$ being directly proportional to the magnetism, m.

Measuring the capacitance change will always lead to inaccurate results, however, due to drift and variances in the distance d between the capacitor plates. In order to obtain accurate measurements of anisotropic materials, a different measurement method is required.

The nulling loops 67 of the cantilever 10 of the present invention allow the magnetism of the sample to be measured directly by measuring the current, $I_n$, through the nulling loops required to maintain a constant gap, and therefore a constant capacitance, between the metallized plate 32 and bottom conducting layer 18. The current, $I_n$, applied to single turn nulling loops 67 bounding an area, A, creates a magnetic moment, $m_n$, as defined by the equation $m_n = I_n \times A$, which is directed anti-parallel to the magnetic field B which is creating the torque $\tau$. If the two magnetic moments, m and $m_n$, are equal, the gap and capacitance will remain constant. Therefore, by measuring the current In through the nulling loops 67 required to maintain the cantilever 10 in the balanced state, the magnetism of the sample 40 can be accurately determined.

The sensitivity of the device in this mode is dependent on the strength of the magnetic field, and improves with higher magnetic field strengths. Given a 1 Tesla uniform field, and a torque sensitivity, $\delta\tau$ of 1 pNm, the magnetic sensitivity, $\delta m$ is:

$$\delta m = \delta\tau/(B \sin \theta) \quad (1)$$

in the case where transverse moments are detected, $\Theta = \pi/2$, and $$\delta m = 1 pNm/1T \quad (2)$$

$$\delta m = 10^{-12} J/T, \quad (3)$$

whereby the sensitivity, $\delta m$, increases proportionately to the strength of the magnetic field in which the cantilever 10 is used.

In the alternate case, where the magnetism of the sample 40 is isotropic, a uniform field will not generate a deflection in the sample 40 and cantilever measurement platform 24. A gradient magnetic field, $\nabla B$ must be used instead to generate a force, F, according to the equation $F = M \cdot \nabla B$, where M is the magnetic moment per unit volume ($J/Tm^3$). The force F will cause a proportional deflection $\Delta d$ of the sample 40, and thereby the platform 24 and capacitor electrode leads 19, toward or away from the metallized plate 32, causing a change in the capacitance $\Delta C$. As explained above in the anisotropic case, this capacitance change $\Delta C$ is directly proportional to the deflection $\Delta d$, and therefore $\Delta C$ F M m, or a change in capacitance directly proportional to the magnetism of the sample 40.

Accordingly, the nulling loops 67 may be used to generate a magnetic moment, $M_n = I_n \times A$, equal and opposite to the magnetic moment generated by the gradient magnetic field $\nabla B$. By measuring the current $I_n$, required to keep the capacitance C constant, the magnetic force is directly measured.

The sensitivity of the cantilever in the force mode is determined as follows. Given a gradient magnetic field $\nabla B = 10$ T/m, which is relatively simple to provide, and a force sensitivity $\delta F = 1$ $\mu$g-force $= 10^{-8}$ N, the moment sensitivity $\delta m$ is:

$$\delta m = \delta F/\nabla B = 10^{-8} N/10 T/m = 10^{-9} J/T \quad (4)$$

assuming a fixed magnitude gradient, such that the sensitivity is independent of the field, and is valid for a zero field. Experimentation has shown that the cantilever 10 made according to the invention can have force sensitivities of between 0.1 and 5 $\mu$g-force depending on the materials used.

The cantilever 10 of the invention eliminates capacitance drift over time, since the cantilever 10 is continually being calibrated as the measurements of the nulling current are made. Further, the insulating properties of the adhesion layers 14, 17 eliminate interaction and leakage currents forming between the nulling loops 67 and the capacitor electrode leads 19.

Background noise and magnetic field variations can also be eliminated by using the cantilever 10 of FIG. 3, where one cantilever arm 22, 24 is used to measure the force exerted on the sample, while the second cantilever arm 22a, 24a acts as a reference. The reference cantilever 22a, 24a signals are subtracted from the sample cantilever 22, 24 signals using standard bridge subtraction techniques. In effect, the cantilever arms act as two arms of a Wheatstone bridge. This further increases the accuracy and sensitivity of the magnetometer.

Figure 5:
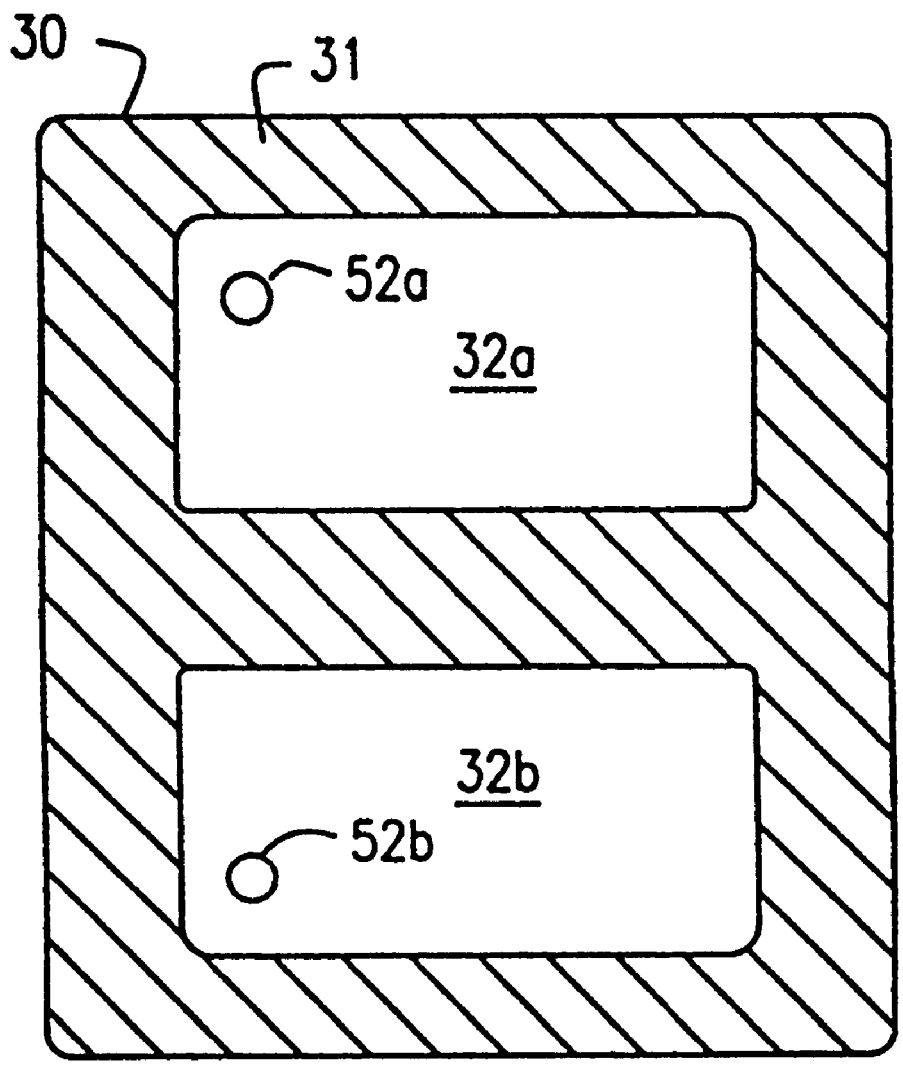
FIG. 5 is top plan view of the bottom capacitance plate used with the cantilever of FIG. 6.
Figure 6:
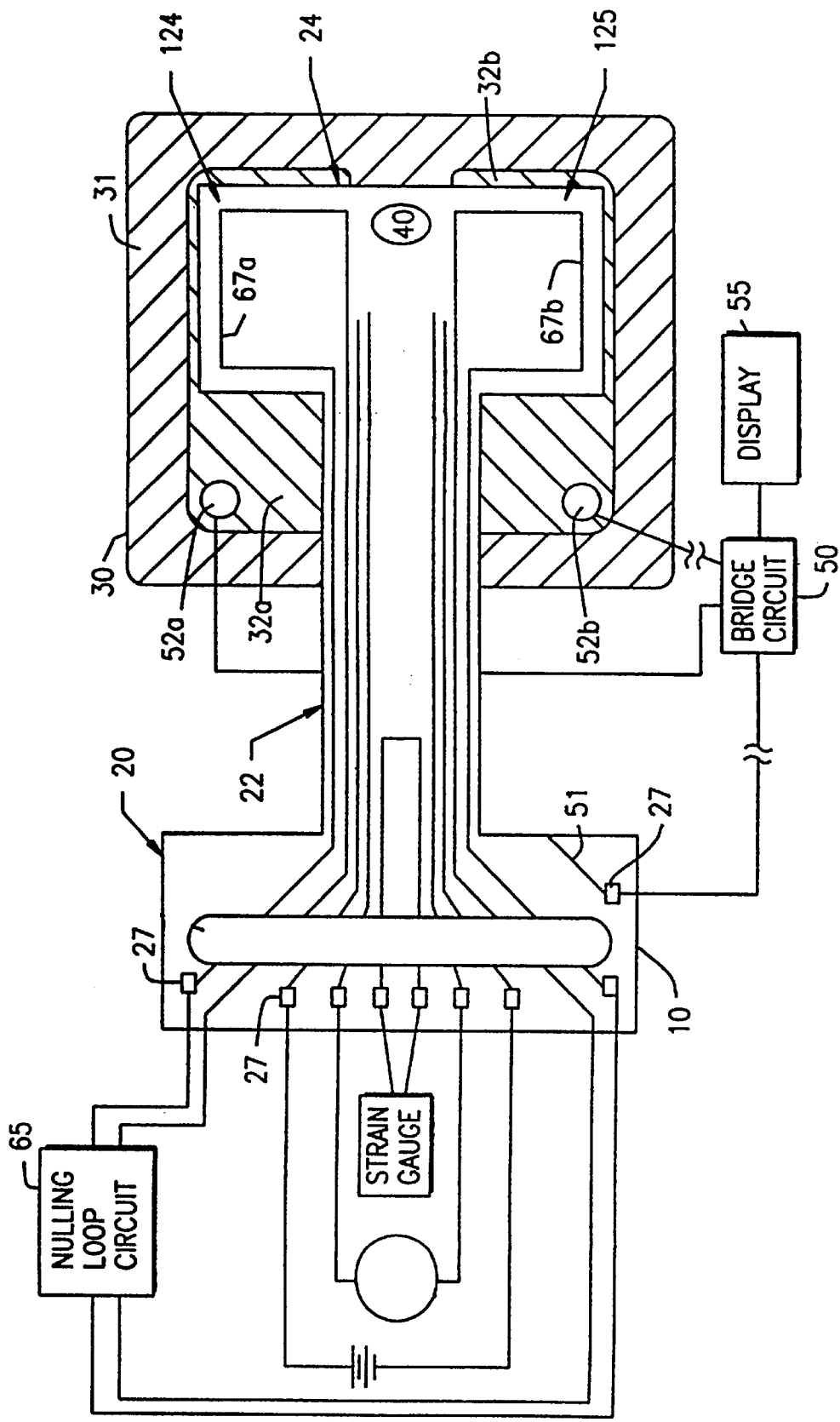
FIG. 6 is an electro-mechanical schematic top plan view of an alternate embodiment of the cantilever.

FIGS. 5 and 6 show an alternate embodiment of the cantilever having two separate nulling loops 67a, 67b with both ends of each loop 67a, 67b connected to the nulling loop circuit 65. The nulling loop circuit 65 is modified to permit independent control of each loop 67a, 67b.

In this embodiment, the metallized plate 32 is provided as two electrically isolated plates 32a, 32b (best shown in FIG. 5). One plate 32a, 32b is provided beneath each side, or wing 124, 125 of the measurement platform 24. The bottom of cantilever 10 is the same as in FIG. 4, with electrode leads 19 connected to bus 35 and lead 51. Connector lead 51 and metallized plate connectors 52a, 52b are all electrically connected to bridge circuit 50 to sense a differential capacitance between each set of metallized plates 32a, 32b and electrode leades 19 The independence of the nulling loop 67a, 67b controls and the differential capacitance sensed from the metallized plates 32a, 32b and electrode leads 19 generated beneath each wing 124, 125, permits even greater accuracy in the detection and elimination by compensation of deflections of the cantilever wings 124, 125 toward one plate 32a, 32b and away from the other plate 32b, 32a. One such instance is where the sample 40 generates a magnetic torque about an axis through the center of the cantilever platform 24 and neck 22.

Nulling loops 167a, 167b arranged in a configuration which even further improve the calibration accuracy of the cantilever 10 are shown in FIGS. 7–11. The interaction of a magnetic field with the nulling loops 67 of FIGS. 2 and 3, for example, creates both magnetic force and magnetic torque terms which are mixed. In the configurations shown in FIGS. 7–11, however, nulling loops 167a, 167b are arranged to separate the magnetic force and magnetic torque terms exerted on the cantilever 10 so that only one of the two terms is generated by interaction with the magnetic field and nulled, as further described below.

Figure 7:
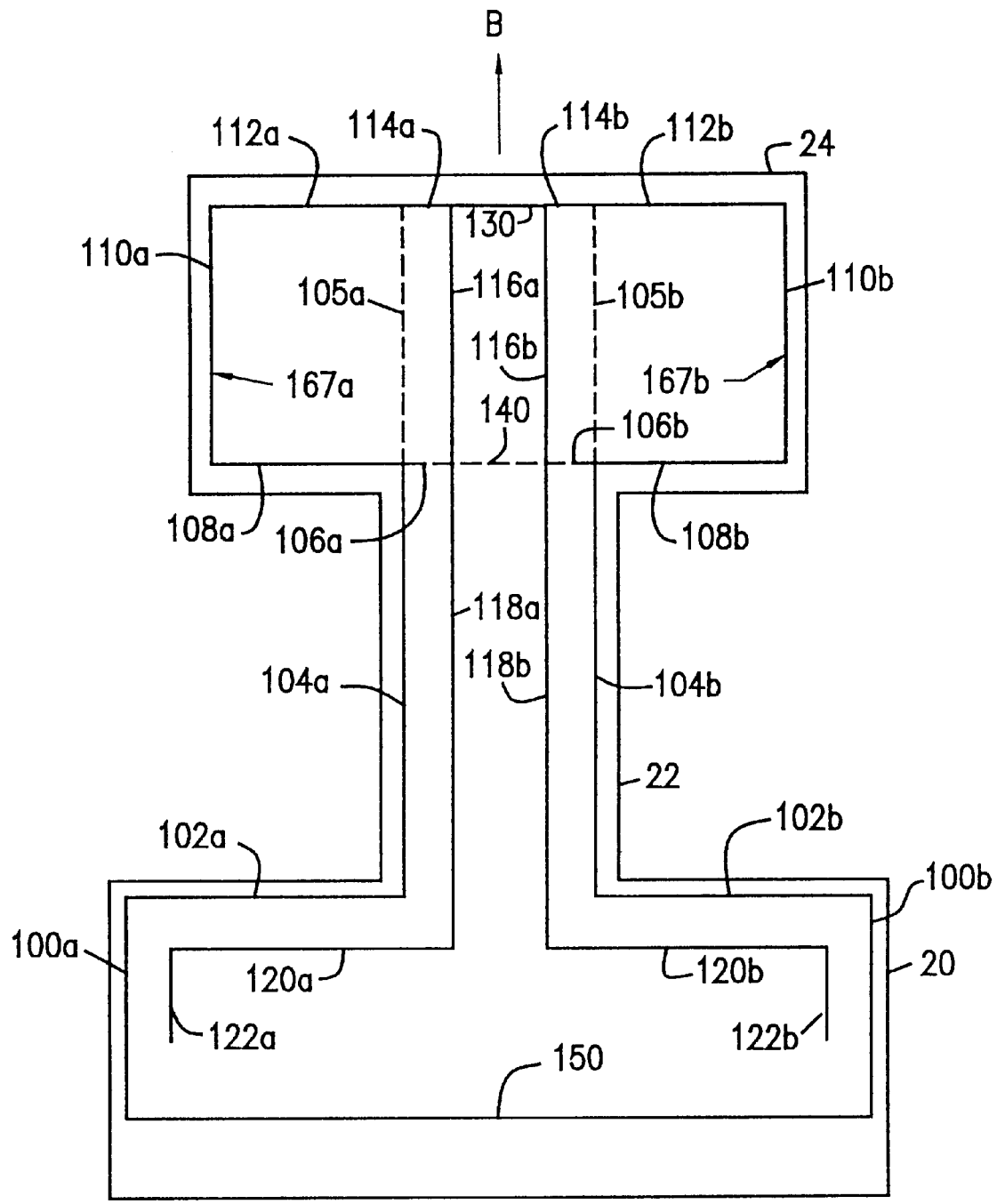
FIG. 7 is an electro-mechanical schematic top plan view of a nulling loop configuration of the invention.

The configuration of FIG. 7 represents a torque-only arrangement. The nulling loops 167a, 167b are each comprised of a series of segments: 100a, 102a, 104a, 108a, 110a, 112a, 114a, 116a, 118a, 120a, 122a; and 100b, 102b, 104b, 108b, 110b, 112b, 114b, 116b, 118b, 120band 122b, respectively. Additionally, one or both cross-segments 130, 140 and segment 150 are deposited as part of the top conducting layer as single or multiple conducting layers. The cross-segments 130, 140 have the effect of canceling out unbalanced magnetic force terms exerted on the cantilever 10 due to the presence of segments 114a, 114b and absence of a loop segment at loop gaps 106a, 106b between the corners of conductor segments 104a, 104b and 108a, 108b and the junction of segments 116a, 116b and 118a, 118b.

If the cross-segments 130, 140 and segment 150 are not present, when a magnetic field F acting parallel to a horizontal axis of the cantilever 10 is present, loop sections formed by segments 108a, 110a, 112a, 114a and 116a and 108b, 110b, 112b, 114b, 116b, and 118b interact with the magnetic field F to generate the feedback or calibration signal. This signal has mixed torque and force components however. Sections 108a, 108b and 112a, 112b generate a pure torque, or couple, term, while sections 114a, 114b generate a pure force term normal to the plane of the cantilever centered along a line joining these segments. The behavior of the cantilever 10 under the influence of a force acting normal to the surface at the measurement platform 24 free end is different from that of a cantilever 10 acting under the influence of a couple at the free end.

However, when at least one of cross-segments 130, 140 is present with segment 150, the feedback circuit interacts with the magnetic field F to generate a pure torque, or magnetic couple, component. Cross-segment 130 has the effect of generating a force component which essentially cancels the force component generated by segments 114a, 114b. Cross-segment 140 converts the unbalanced force generated by segments 114a, 114b into a couple. The widths and thicknesses of cross-segments 130, 140 are chosen to balance or cancel the unbalanced forces caused by the presence of segments 114a, 114b and/or the absence of loop segments at gaps 106a, 106b. The cross-segments 130, 140 are aligned on the centerlines of lines joining segments 114a, 114b and 108a, 108b, respectively. Segments 122a, 122b are connected to the nulling loop circuit 65.

Figure 7A:
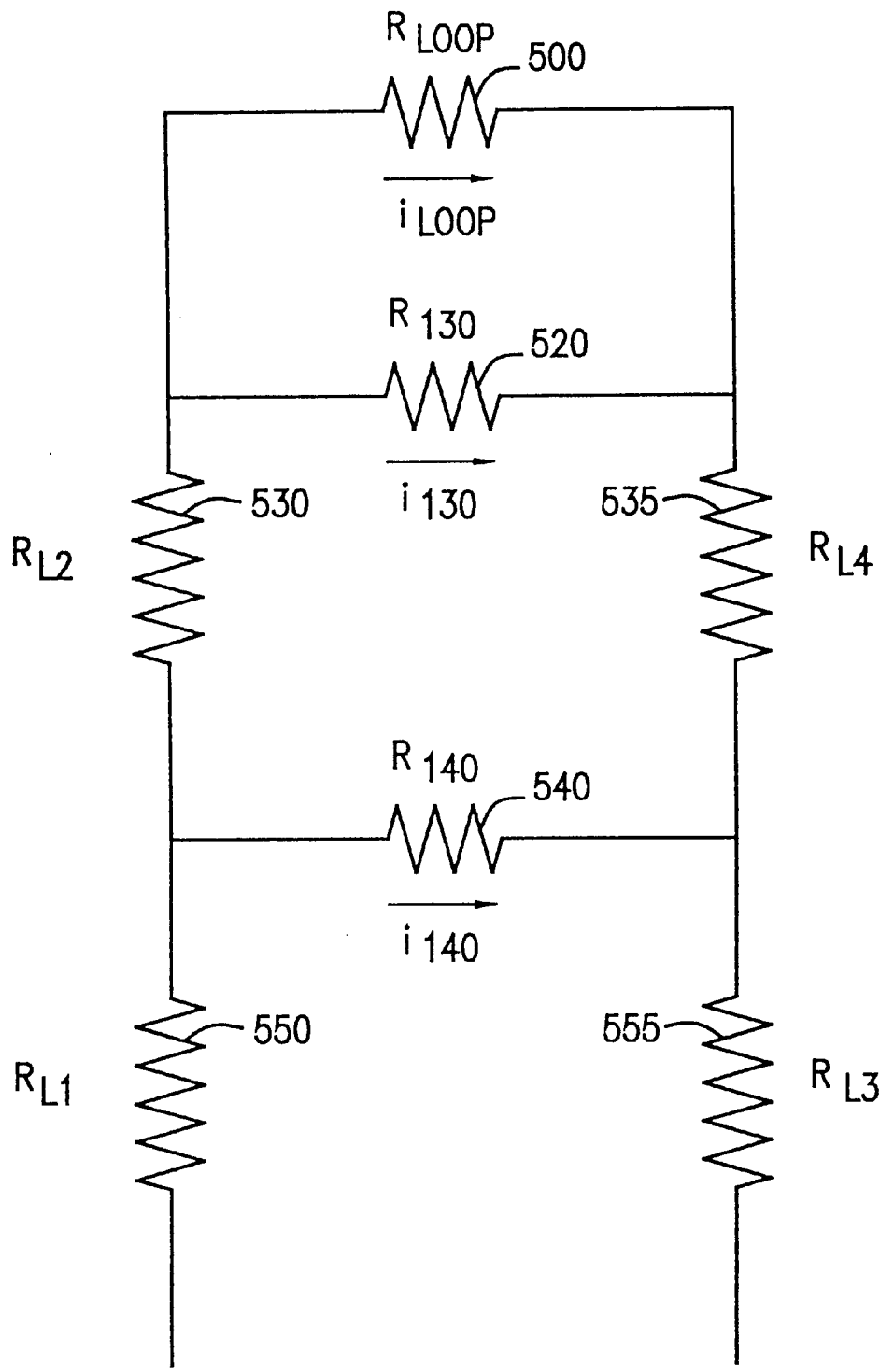
FIG. 7a is a electrical circuit diagram of an equivalent circuit for the nulling loop configuration of FIG. 7.

FIG. 7a shows an equivalent resistive circuit for the nulling loops 167a, 167b in FIG. 7 with both cross-segments 130, 140 and segment 150 present. Resistor 500 represents the resistance through the path formed by segments 114a to 100a, 150, and 100b to 114b. Resistor 520 is the resistance of cross-segment 130 and resistor 540 is the resistance of cross-segment 140. Resistors 530 and 535 represent the resistance in segments 116a and 116b, respectively, while resistors 550 and 555 represent the resistances of the remaining segments of each loop: 118a, 120a, 122a and 118b, 120b, 122b, respectively. It is assumed that these resistances are connected by conductors of infinite conductivity for ideal circuit analysis. This circuit permits calculation of the necessary widths and thicknesses, or cross-sectional area, of cross-segments 130, 140 since the lengths of the cross-segments 130, 140 are known. The cross-sectional area of the cross-segments 130, 140 affect their respective resistances, and thus, the current passing through each cross-segment 130, 140. The relationship between the physical dimensions of a resistor, its resistance and current carrying capacity is well known.

If the current through resistor 500 is defined as $i_{loop}$, then the current flowing through unbalanced segments 114a, 114b generates an unbalanced force:

$$F_{unbalanced} = i_{loop}(L_{114a} + L_{114b}) \times B \quad (5)$$

where B is the magnetic field strength and $L_{114a}$ and $L_{114b}$ are the lengths of segments 114a and 114b, respectively. Similarly, the forces generated by cross-segments 130, 140 are given by:

$$F_{130} = (i_{130}L_{130} \times B) \quad (6)$$

and $$F_{140} = (i_{140}L_{140} \times B) \quad (7)$$

where $L_{130}$ and $L_{140}$ are the respective lengths of cross-segments 130, 140. The forces $F_{130}$, $F_{140}$ are opposite in direction to $F_{unbalanced}$. The force $F_{130}$ acts at the same distance from the cantilever base 20 as $F_{unbalanced}$ while $F_{140}$ acts at the same distance as the force generated by segments 108a, 108b, thereby creating a couple. Using these relationships, one can solve the equations for a balanced force condition using basic circuit analysis technique to determine the necessary widths and thicknesses for the cross-segments 130, 140. Since the resistances of resistors 520 and 540 are changed by altering the cross-sectional areas, and thereby the currents $i_{130}$, $i_{140}$, the widths and thicknesses of the cross-segments 130, 140 may be tuned to create a balanced force condition.

Figure 8:
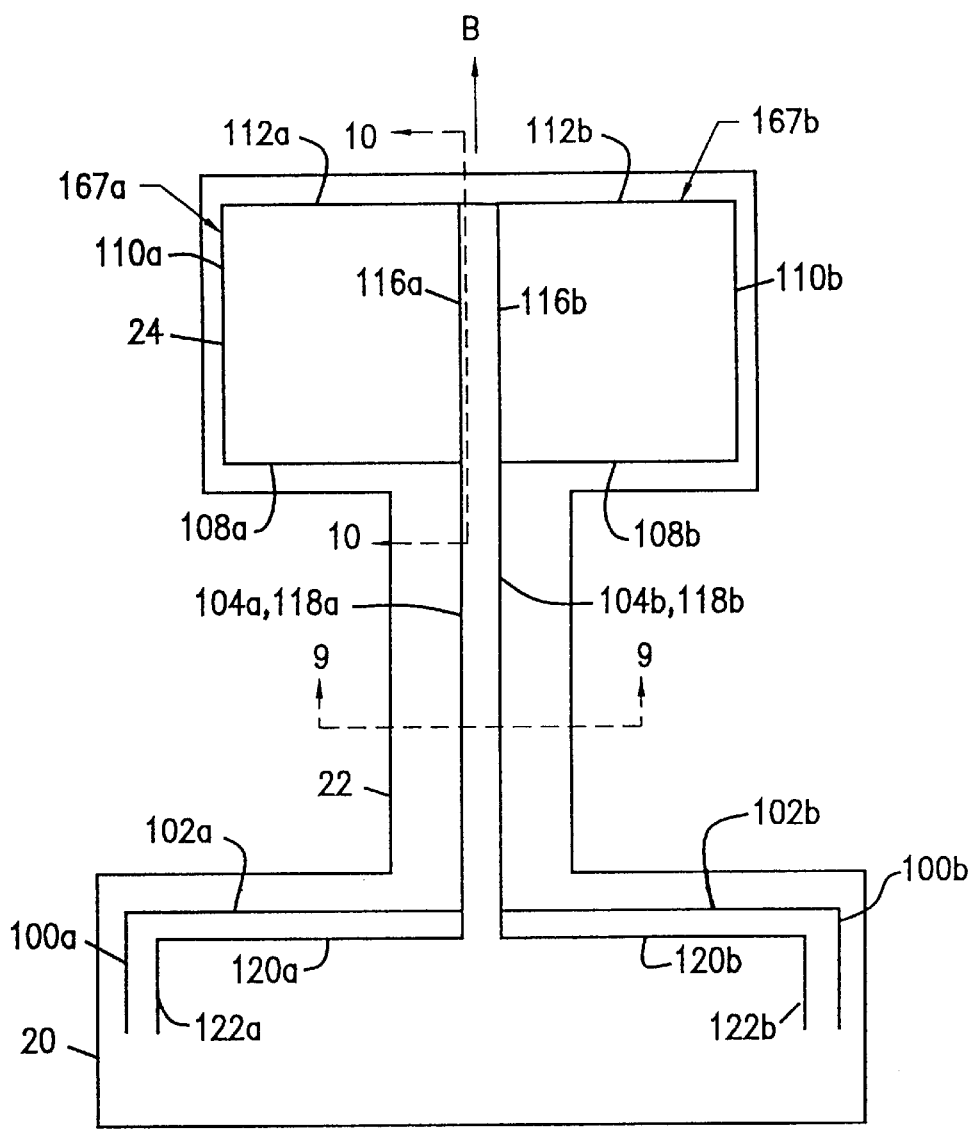
FIG. 8 is an electro-mechanical schematic top plan view of an alternate nulling loop configuration of the invention.
Figure 9:
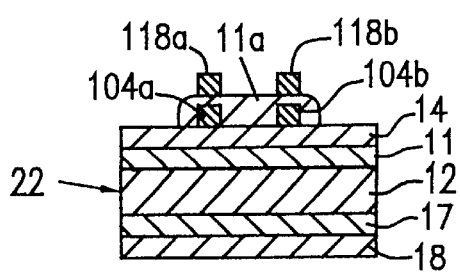
FIG. 9 is a sectional view of the cantilever neck taken along line 9—9 of FIG. 8.
Figure 10:
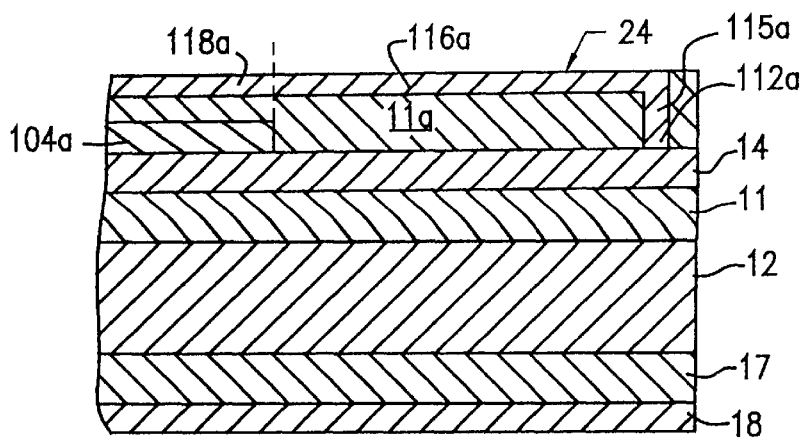
FIG. 10 is a partial sectional view of the cantilever measurement platform taken along line 10—10 of FIG. 8.

FIGS. 8–10 illustrate another nulling loop configuration in which the forces are balanced so that only a-torque term is sensed by the nulling loops 167a, 167b. In this embodiment, the loop segments 104a, 104b are aligned vertically separated from segments 118a, 118b at the same horizontal position on the cantilever neck 22 in two layers separated by an insulator 11a. Insulator 11a may be a material similar to the insulating layer 11 used on the dielectric substrate 12. The top metal conducting layer of loop segments 100a–222b may be composed of one or more sublayers of different materials.

As seen in the sectional view of FIG. 10, loop segment 118a passes over loop segment 104a and becomes loop segment 116a. Segment 116a is still vertically disposed in a second conducting layer above the conducting layer of the loop segments 108a, 110a, 112a on the measurement platform 24. A small vertical section 115a through the insulator 11a is used to connect segment 116a to segment 112a. Further, a vertical section may also be used to connect segment 118a to segment 120a, or segments 120a and 122a may be deposited in the same layer at the same vertical displacement as segment 118a. The same configuration may be used in loop 167b on the other side of measurement platform 24.

The nulling loops 167, 167a of FIGS. 7–10 do not have any unbalanced sections, as the loops formed by segments 108a, 110a, 112a, and 116a are complete for magnetic fields acting parallel to the horizontal axis of the cantilever 10. Thus, only torque, or couple, components are sensed by this loop configuration as well.

Figure 11:
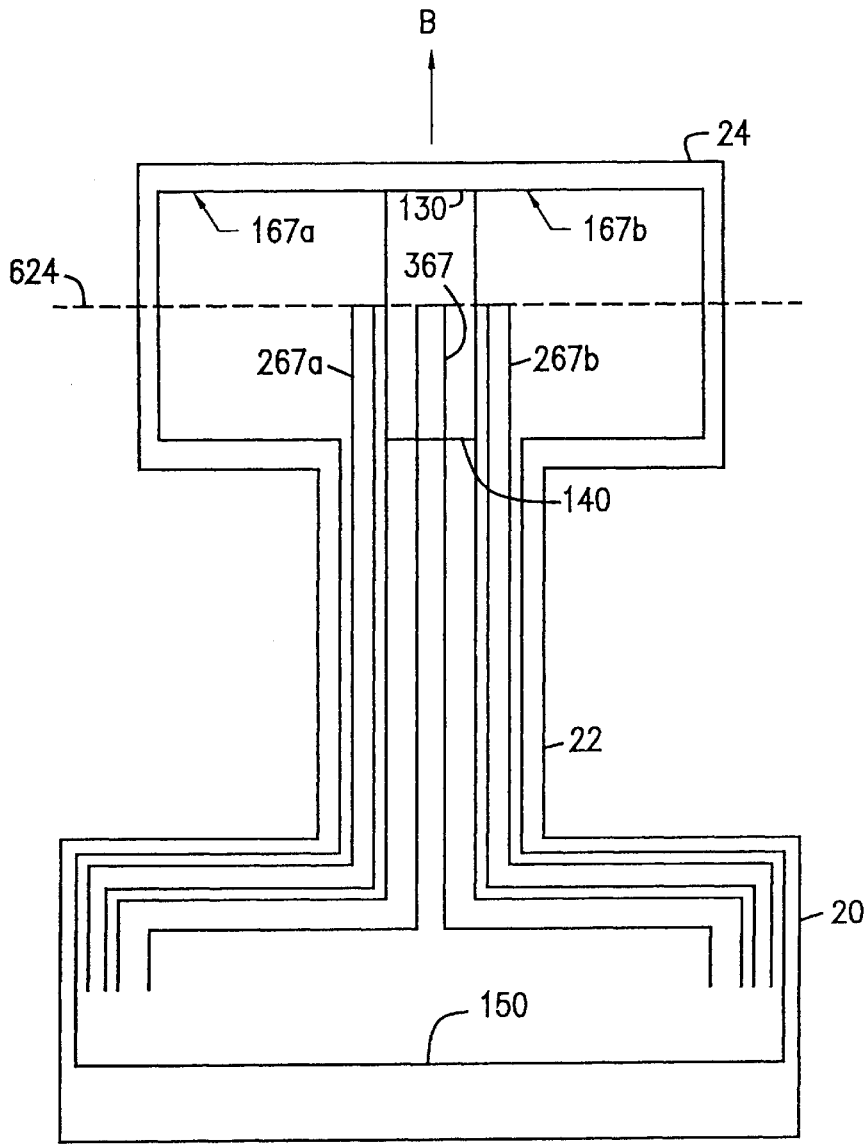
FIG. 11 is an electro-mechanical schematic top plan view of a force-only nulling loop configuration of the invention.

Nulling loop configurations for generating only force components by interaction with a magnetic field are displayed in FIG. 11. Either a pair of loops 267a, 267b or a single, centrally disposed loop 367 are deposited as part of the top conducting layer 16 on the cantilever 10. A measurement platform centerline 624 defines both a bisection line for nulling loops 67 or 167a, 167b and for the position of a sample 40 being tested. Each of the force-generating loops 267a, 267b and 367 has a short end segment 268a, 268b, 368 aligned on the centerline 624.

These force-generating loops 267a, 267b and 367 only generate a magnetic force in response to interaction with a magnetic field B parallel to the horizontal axis. Thus, it is beneficial to combine the force-generating loops 267a, 267b or 367 with one of the other nulling loop configurations shown in FIGS. 7–10 so that both the separated torque and force components may be nulled, or alternatively with the mixed term loops 67 shown in FIGS. 1–6.

When force-generating loops 267a, 267b are used with other nulling loops 67 or 167a, 167b, they are positioned within the other nulling loops 67 or 167a, 167b, centered between the loop segments deposited on the cantilever neck 22. In the case where the central force-generating loop 367 is used, it may be electrically isolated by being deposited on an additional insulating layer above cross-segment 140. The force-sensitive loops 267a, 267b and 367 may be connected to the nulling loop circuit 65 in a manner similar as described with nulling loops 67.

While a specific embodiment of the invention has been shown and described in detail to illustrate the application of the principles of the invention, it will be understood that the invention may be embodied otherwise without departing from such principles.

What is claim is:

1. A nulling loop configuration for a cantilever of a cantilever magnetometer having a planar top surface and a planar bottom surface, a measurement platform, an elongated neck, and a base, the elongated neck connecting the base and the measurement platform, the nulling loop configuration comprising:

a pair of spaced apart symmetrical nulling loops on the measurement platform such that a sample may be placed between them on the measurement platform, the nulling loops connected to each other in the base;

balancing means for balancing unbalanced magnetic force and torque components exerted on the cantilever due to interaction of the pair of nulling loops with a magnetic field, such that at least one of the force and torque components may be independently balanced.

2. A nulling loop configuration according to claim 1, wherein the balancing means comprises at least one cross-segment between the pair of nulling loops.

3. A nulling loop configuration according to claim 2, further comprising force-generating loop means for balancing only a magnetic force component generated by interaction with a magnetic field.

4. A nulling loop configuration according to claim 3, wherein the force-generating loop means comprises a force-generating loop centrally positioned between the pair of nulling loops having a loop end segment located on a line bisecting each of the pair of nulling loops.

5. A nulling loop configuration according to claim 4, wherein the force-generating loop is deposited in a conducting layer electrically isolated from the at least one cross-segment.

6. A nulling loop configuration according to claim 3, wherein the force-generating loop means comprises a pair of force-generating loops, each force-generating loop positioned centered within each of the pair of nulling loops and having an end segment located on a line bisecting each of the pair of nulling loops.

7. A nulling loop configuration according to claim 2, wherein the at least one cross-segment is positioned on a centerline of a line connecting a pair of aligned segments of the pair of nulling loops, each segment forming a portion of the corresponding nulling loop.

8. A nulling loop configuration according to claim 7, wherein the at least one cross-segment comprises first and second cross-segments.

9. A nulling loop configuration according to claim 1, wherein the balancing means comprises forming each of the pair of nulling loops in at least two conducting layers, a first loop portion of each loop being deposited in one layer horizontally aligned with and vertically spaced above a second loop portion deposited in a second layer, such that each loop lacks any unbalanced segments on the measurement platform.

10. A nulling loop configuration according to claim 9, wherein a vertical conducting portion connects the first loop portion in the second layer to the nulling loop deposited in the first layer at a point where the first loop portion no longer overlies the second loop portion.

11. A nulling loop configuration according to claim 1, wherein the balancing means comprises force-generating loop means for balancing only magnetic force component generated by interaction with a magnetic field.

12. A nulling loop configuration according to claim 11, wherein the force-generating loop means comprises a force-generating loop centrally positioned between the pair of nulling loops having a loop end segment located on a line bisecting each of the pair of nulling loops.

13. A nulling loop configuration according to claim 11, wherein the force-generating loop means comprises a pair of force-generating loops, each force-generating loop positioned centered within each of the pair of nulling loops and having an end segment located on a line bisecting each of the pair of nulling loops.

* * * * *